United States Patent [19]

Mori

[11] Patent Number: 4,982,167
[45] Date of Patent: Jan. 1, 1991

[54] ZONE REFLECTION TYPE MICROWAVE OSCILLATOR

[76] Inventor: Yukio Mori, c/o Murata Manufacturing Co., Ltd. 26-10, Tenjin, 2-chome, Nagaokakyo, Japan

[21] Appl. No.: 402,057

[22] Filed: Sep. 1, 1989

[30] Foreign Application Priority Data

Sep. 2, 1988 [JP] Japan .......................... 63-116260[U]

[51] Int. Cl.$^5$ ............................................. H03B 7/00
[52] U.S. Cl. ................................. 331/96; 331/107 SL
[58] Field of Search ............. 331/96, 107 R, 107 DP, 331/107 SL, 117 D

[56] References Cited

U.S. PATENT DOCUMENTS

| 4,445,097 | 4/1984 | Godart et al. | 331/96 X |
| 4,565,979 | 1/1986 | Fiedziuszko | 331/96 X |
| 4,736,168 | 4/1988 | Nagata | 331/96 |

Primary Examiner—Robert J. Pascal

[57] ABSTRACT

A zone reflection type microwave oscillator using a dielectric resonator wherein a comparatively simple DC cutting circuit is formed which is capable of preventing the DC bias current from leaking into the terminal resistor without the use of any chip capacitor so as to improve the stability of the oscillation output and reduce the price.

7 Claims, 1 Drawing Sheet

ZONE REFLECTION TYPE MICROWAVE OSCILLATOR

BACKGROUND OF THE INVENTION

The present invention generally relates to a zone reflection type microwave oscillator using a dielectric resonator, and more particularly, to a construction of a DC cutting circuit to be in for the microwave oscillator.

Generally, referring to FIG. 3 which is a circuit diagram showing the essential portions of a conventional microwave oscillator of this type, a microstrip line 1 is connected between a transistor Tr of a bipolar type and a terminal resistor R. A dielectric resonator 2 is magnetically coupled with the strip line 1 to constitute a resonance circuit.

As a bipolar transistor Tr is used as a current driving type of negative resistance element in the microwave oscillator, it is necessary for a bias current to flow into the base of the bipolar transistor Tr. In order to prevent the bias current from flowing toward the terminal resistor R side, a chip capacitor C is connected between the microstrip line 1 and the terminal resistor R.

However, in the conventional microwave oscillator of the above-described construction, there is a problem in that the oscillation becomes unstable because of variations of the chip capacitor C itself, and the amount of the solder applied during the mounting operation of the chip capacitor C onto the basic plate.

Also, there is another problem in that the price of the microwave oscillator itself becomes higher, because a chip capacitor C as described hereinabove is expensive.

SUMMARY OF THE INVENTION

Accordingly, an object of the present invention is to provide a microwave oscillator which forms a comparatively simple DC cutting circuit capable of preventing the DC bias current from being leaked in the direction toward the terminal resistor side without the use of the chip capacitor so as to improve the stability of the oscillation output and reduce the price.

In accomplishing the object, according to one preferred embodiment of the present invention, there is provided a zone reflection type of microwave oscillator which is constituted in coupling magnetically a dielectric resonator with a microstrip line between a current driving type of negative resistance element and a terminal resistor so as to constitute a resonance circuit, and which is characterized in that the microstrip line is divided into a negative resistance element side and a terminal resistor side at a position towards the terminal resistor, not towards the magnetic coupling portion with respect to the dielectric resonator, and said terminal resistor side and negative resistance element side are oppositely arranged facing each other across a given gap so as to form an electrostatic coupling capacity therebetween.

As the microstrip line is divided at a position towards the terminal resistor, not towards the magnetic coupling portion with respect to the dielectric resonator and has two oppositely arranged sides separated by the given gap, the bias current which is to flow into the base of the current driving type of negative resistance element is prevented from flowing into the terminal resistor side.

BRIEF DESCRIPTION OF THE DRAWINGS

These and other objects and features of the present invention will become apparent from the following description of a preferred embodiment thereof with reference to the accompanying drawings, in which.

DETAILED DESCRIPTION OF THE INVENTION

Figure 1:
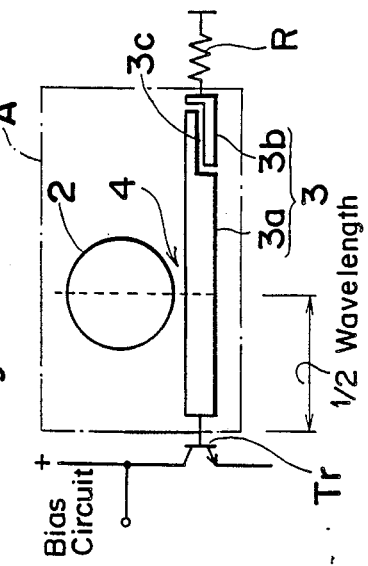
FIG. 1 is a circuit diagram showing the essential portions of a microwave oscillator according to one embodiment of the present invention.

Before the description of the present invention proceeds, it is to be noted that like parts are designated by like reference numerals throughout the accompanying drawings.

Referring now to the drawings, there is shown in FIG. 1 a microwave oscillator according to one embodiment of the present invention, in which a microstrip line 3 is connected between a bipolar type of transistor Tr which forms one embodiment of the current driving type of negative resistance element and the terminal resistor R. A dielectric resonator 2 is magnetically coupled with the microstrip line 3 to constitute a resonance circuit A. In the microwave oscillator, the bipolar transistor Tr is used as a current driving type of negative resistance element, so the bias current flowing into the base of the bipolar transistor Tr is required to be cut so that the bias current will not flow into the terminal resistor R side of the microstrip line 3.

A noteworthy point in the microwave oscillator of in the present embodiment is that the microstrip line 3 is to be divided into a first microstrip line 3a on the transistor side and a second microstrip line 3b on the terminal resistor side at a position spaced away by ½ or more of the wavelength from the connecting portion between the microstrip line 3 and the bipolar transistor Tr, and towards the terminal resistor R, and not towards the magnetic combination portion 4 with respect to the dielectric resonator 2. The first microstrip line 3a on the transistor side and the second microstrip line 3b on the terminal resistor side are oppositely arranged on opposite sides of a gap 3c of the parallel width size of, for example, 0.2 mm for electrostatic coupling.

Figure 3:
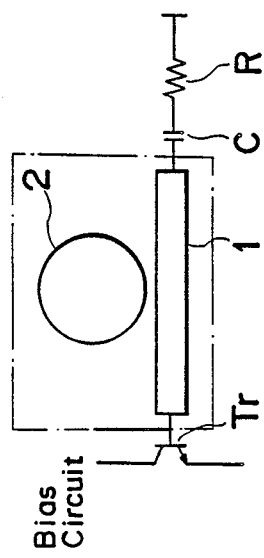
FIG. 3 is a circuit diagram showing the essential portions of a conventional microwave oscillator, as already referred above.

By the above-described construction, a comparatively simple DC cutting circuit may be formed without the use of expensive components such as the chip capacitor C, as shown in FIG. 3, of the conventional microwave oscillator Namely, by the above-described construction, it is possible to prevent the bias current, which flows into the base of the bipolar transistor Tr, from flowing into the terminal resistor side R.

As described in the present embodiment it is preferable to set the size of the gap 3c as small as for example 0.2 mm to retain the given capacity Accordingly, the large return loss may provided with respect to the terminal resistor R.

Figure 2:
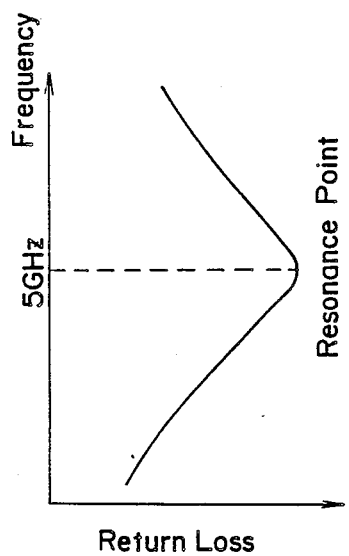
FIG. 2 is a frequency characteristic chart related to the the electrostatic coupling portion of the microwave oscillator.

FIG. 2 shows the frequency characteristics at the electrostatic coupling portion of the DC cutting circuit composed of the first microstrip line 3a on the transistor side and the second microstrip line 3b on the terminal resistor side. The reason why the position of the electrostatic coupling portion composed of the microstrip line 3a on the transistor side and the microstrip line 3b on the terminal resistor side in the above-described embodiment is provided toward the terminal resistor R side, not toward the magnetic coupling portion 4 with respect to the dielectric resonator 2, is that if the electrostatic coupling portion were provided between the bipolar transistor Tr and the magnetic coupling portion 4, reflection would be caused at the electrostatic coupling portion, thus causing abnormal oscillation and characteristic deterioration.

As is clear from the foregoing description, according to the arrangement of the present invention, there is a zone reflection type of microwave oscillator which magnetically couples the dielectric resonator with a microstrip line between the current driving type of negative resistance element and the terminal resistor so as to constitute a resonance circuit, and which is characterized in that the microstrip line is divided into the negative resistance element side and the terminal resistor side at a position towards the terminal resistor, not towards the magnetic coupling portion with respect to the dielectric resonator, and said two sides are facing each other across arranged the given gap so as to be electrostatically coupled so that the DC bias current may be prevented from leaking onto the terminal resistor side, requiring the use of any expensive chip capacitor. As no chip capacitor is used, the stability of the oscillation output may be improved, and the price may be reduced.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A zone reflection type microwave oscillator including a resonance circuit in which a dielectric resonator is coupled magnetically with a microstrip line connected between a current driving type of negative resistance element and a terminal resistor, wherein the microstrip line is divided into a negative resistance element side and a terminal resistor side at a position towards the terminal resistor, not towards the magnetic coupling portion with respect to the dielectric resonator, and said terminal resistor side and negative resistance element side are arranged separated by a given gap so as to form an electrostatic coupling capacity therebetween.

2. A microwave oscillator as in claim 1, wherein said gap is spaced away from the negative resistance element by at least $\frac{1}{2}$ of the resonant wavelength of the resonance circuit.

3. A microwave oscillator as in claim 2, wherein said gap is closer to the terminal resistor than to said dielectric resonator.

4. A microwave oscillator as in claim 3, wherein said gap is no more than substantially 0.2 mm wide.

5. A microwave oscillator as in claim 1, wherein said gap is closer to the terminal resistor than to said dielectric resonator.

6. A microwave oscillator as in claim 5, wherein said gap is no more than substantially 0.2 mm wide.

7. A microwave oscillator as in claim 1, wherein said gap is no more than substantially 0.2 wide.

* * * * *